US010419000B2

(12) United States Patent
Kim et al.

(10) Patent No.: US 10,419,000 B2
(45) Date of Patent: Sep. 17, 2019

(54) LOOK UP TABLE INCLUDING A NONVOLATILE MEMORY ELEMENT, FPGA INCLUDING THE LOOK UP TABLE, AND METHOD FOR DESIGNING THE FPGA

(71) Applicants: SK hynix Inc., Icheon (KR); INDUSTRY-ACADEMIC COOPERATION FOUNDATION, YONSEI UNIVERSITY, Seoul (KR)

(72) Inventors: Jeongbin Kim, Seoul (KR); Kitae Kim, Seoul (KR); Kyungseon Cho, Seoul (KR); Seungjin Lee, Seoul (KR); Daehyung Cho, Seoul (KR); Eui-Young Chung, Seongnam (KR); Hongil Yoon, Seoul (KR)

(73) Assignees: SK HYNIX INC., Icheon (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 16/107,906

(22) Filed: Aug. 21, 2018

(65) Prior Publication Data
US 2019/0199353 A1    Jun. 27, 2019

(30) Foreign Application Priority Data
Dec. 22, 2017    (KR) .......................... 10-2017-0177688

(51) Int. Cl.
*H01L 25/00*    (2006.01)
*H03K 19/177*    (2006.01)

(52) U.S. Cl.
CPC ... *H03K 19/17728* (2013.01); *H03K 19/1776* (2013.01); *H03K 19/17736* (2013.01)

(58) Field of Classification Search
None
See application file for complete search history.

(56) References Cited

U.S. PATENT DOCUMENTS 6,542,000 B1    4/2003    Black et al.
8,754,670 B2 *   6/2014    Kim .................. H03K 19/17704
                                                326/38
(Continued)

FOREIGN PATENT DOCUMENTS

KR    10-1308579 B1    9/2013

OTHER PUBLICATIONS

Vaughn Betz et al., "Architecture and CAD for deep-submicron FPGAs", 2012, pp. 1-4, vol. 497, Springer Science & Business Media.
(Continued)

*Primary Examiner* — Anh Q Tran

(57) ABSTRACT

A Look Up Table (LUT) includes a data storage circuit including a plurality of nonvolatile memory elements respectively corresponding to a plurality of applications, the data storage circuit being configured to select one of the plurality of nonvolatile memory elements according to an application selection signal; an amplification circuit configured to amplify a signal output from the selected nonvolatile memory element according to an enable signal output from a decoder; and a write control circuit configured to program the selected nonvolatile memory element with information corresponding to a data signal according to a write signal.

8 Claims, 7 Drawing Sheets

(56) References Cited

U.S. PATENT DOCUMENTS

| | | | |
|---|---|---|---|
| 9,437,260 B2* | 9/2016 | Prenat | H03K 19/0033 |
| 10,051,265 B2* | 8/2018 | Kim | G11C 11/41 |
| 2011/0122709 A1* | 5/2011 | Kim | G11C 14/0054 |
| | | | 365/189.05 |

OTHER PUBLICATIONS

Eriko Nurvitadhi et al., "Accelerating Binarized Neural Networks: Comparison of FPGA, CPU, GPU, and ASIC", In Field-Programmable Technology (FPT), Dec. 2016, pp. 77-84, IEEE.

Johnathan Rose et al., "The VTR Project: Architecture and CAD for FPGAs from Verilog to Routing", In Proceedings of the ACM/SIGDA international symposium on Field Programmable Gate Arrays, Feb. 2012, pp. 77-86, ACM.

Kangwook Jo et al., "Variation-tolerant and low power look-up table (LUT) using spin-torque transfer magnetic RAM or non-volatile field programmable gate array (FPGA)", In SoC Design Conference (ISOCC), Oct. 2016, pp. 101-102, IEEE.

Mishchenko, A., "ABC: A System for Sequential Synthesis and Verification", 2007, URL http://www.eecs.berkeley.edu/~alanmi/abc.

Peter Jamieson et al., "Odin II—An Open-source Verilog HDL Synthesis Tool for CAD Research", 18th IEEE Annual International Symposium on Field-Programmable Custom Computing Machines (FCCM), May 2010, pp. 149-156, IEEE.

Robert Brummayer et al., "The AIGER And-Inverter Graph (AIG) Format Version Apr. 27, 2007", May 17, 2007, pp. 1-16.

Somnath Paul et al., "Hybrid CMOS-STTRAM Non-Volatile FPGA: Design Challenges and Optimization Approaches", In Computer-Aided Design, Nov. 2008, pp. 589-592, IEEE.

Lionel Torres et al., "Trends on the Application of Emerging Nonvolatile Memory to Processors and Programmable Devices", In Circuits and Systems (ISCAS), May 2013, pp. 101-104, IEEE.

Vaughn Betz et al., "VPR: A New Packing, Placement and Routing Tool for FPGA Research", In International Workshop on Field Programmable Logic and Applications, Sep. 1997, pp. 213-222, Springer, Berlin, Heidelberg.

Weisheng Zhao et al., "High Speed, High Stability and Low Power Sensing Amplifier for MTJ/CMOS Hybrid Logic Circuits", IEEE Transactions on Magnetics, Oct. 2009, pp. 3784-3787, vol. 45, No. 10, IEEE.

Weisheng Zhao et al., "Spin Transfer Torque (STT)—MRAM-Based Runtime Reconfiguration FPGA Circuit". ACM Transactions on Embedded Computing Systems (TECS), Oct. 2009, pp. 1-16, vol. 9, No. 2, Article 14.

Shuu'Ichirou Yamamoto et al., "Nonvolatile Power-Gating Field-Programmable Gate Array Using Nonvolatile Static Random Access Memory and Nonvolatile Flip-Flops Based on Pseudo-Spin-Transistor Architecture with Spin-Transfer-Torque Magnetic Tunnel Junctions", Japanese Journal of Applied Physics, Nov. 20, 2012, pp. 11PB02-1-11PB02-5, vol. 51, No. 11S, The Japan Society of Applied Physics.

Yue Zhang et al., "Compact Modeling of Perpendicular-Anisotropy CoFeB/MgO Magnetic Tunnel Junctions", IEEE Transactions on Electron Devices, Mar. 2012, pp. 819-826, vol. 59, No. 3, IEEE.

* cited by examiner

<PRIOR ART>

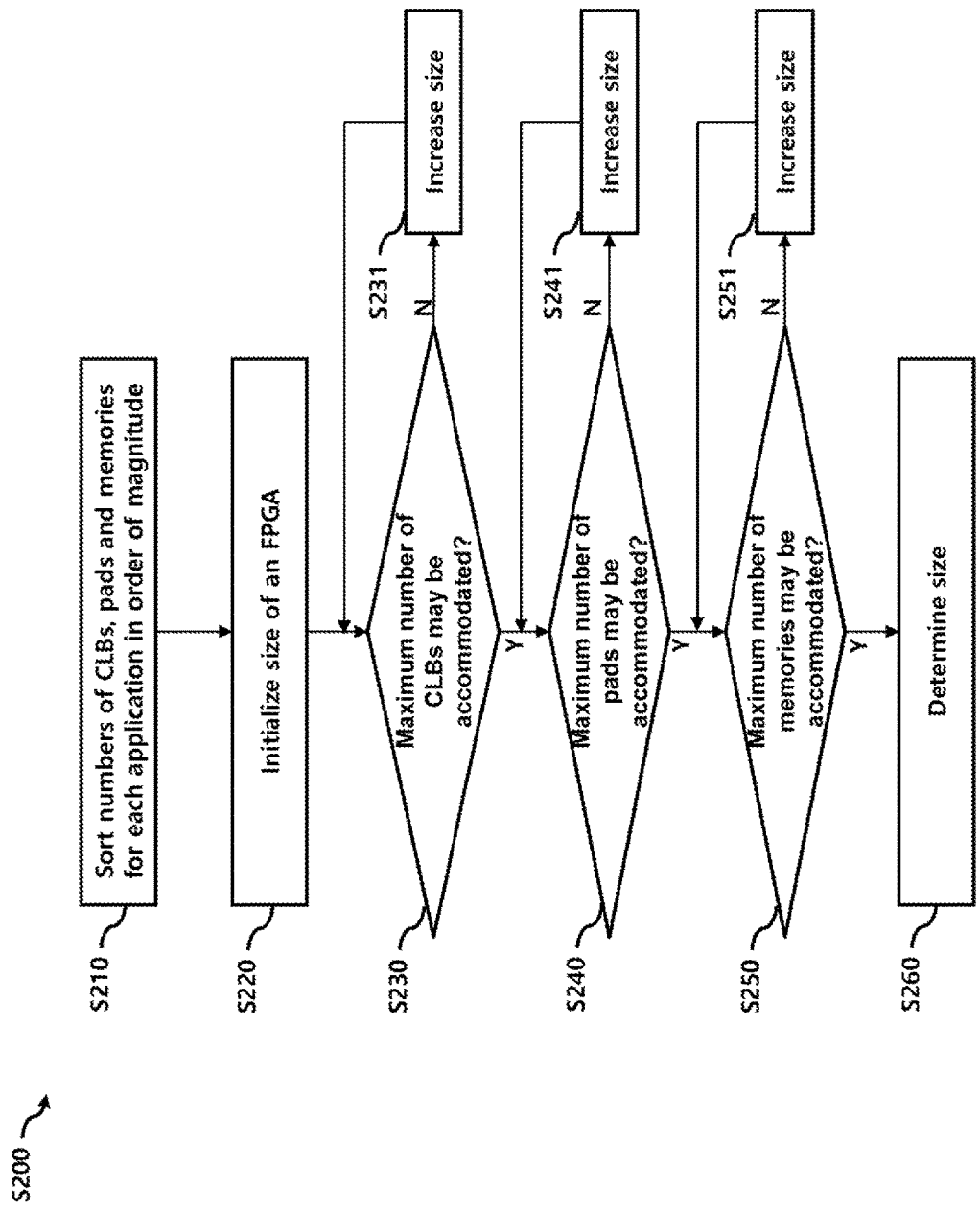

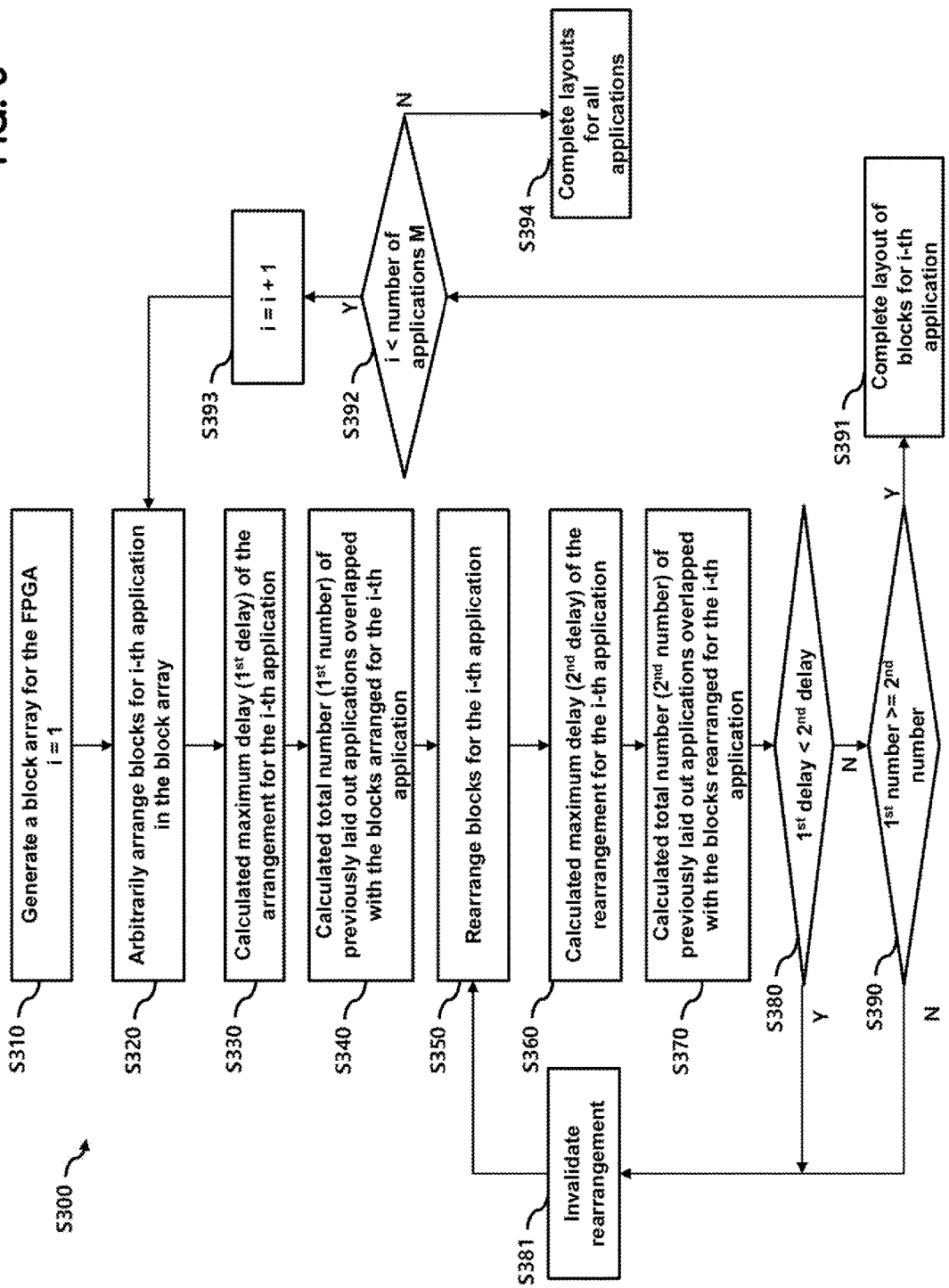

LOOK UP TABLE INCLUDING A NONVOLATILE MEMORY ELEMENT, FPGA INCLUDING THE LOOK UP TABLE, AND METHOD FOR DESIGNING THE FPGA

CROSS-REFERENCE TO RELATED APPLICATIONS

The present application claims priority under 35 U.S.C. § 119(a) to Korean Patent Application No. 10-2017-0177688, filed on Dec. 22, 2017, which is incorporated herein by reference in its entirety.

BACKGROUND

1. Technical Field

Various embodiments of the present disclosure relate to a Look Up Table (LUT) including a nonvolatile memory element, and more particular to an LUT that is used by a plurality of applications, a Field Programmable Gate Array (FPGA) including the LUT, and a method for designing the FPGA.

2. Related Art

A Field Programmable Gate Array (FPGA) is a type of Programmable Logic Device (PLD) that is widely used to design digital circuits that perform specific operations through the programming of the PLD.

An FPGA includes configurable logic blocks (CLBs), input/output blocks (IOBs), and configurable connection circuits that connect the CLBs and the IOBs. The FPGA may further include delay locked loops (DLLs), random access memories (RAMs), and the like.

A CLB includes at least two sub-circuits, one of which is a register circuit such as a flip-flop, the other of which is a function generator circuit that can be implemented with an LUT.

FIG. 1 shows a conventional LUT.

The conventional LUT includes a Static Random Access Memory (SRAM) array 10 and a switch array 20. The SRAM array 10 includes a plurality of SRAMs.

The switch array 20 sets a path so that data stored in any one of the plurality of SRAMs is output as an output signal OUT in accordance with decoding signals A, B, and C.

Such a conventional LUT is easy to implement a combinational logic circuit or a sequential logic circuit, but when the power is interrupted, data stored in the SRAMs are lost and thus the SRAMs must be newly programmed.

Also, when a plurality of applications share one LUT, SRAMs in the LUT must be reprogrammed whenever an application using the LUT is changed.

Since the conventional LUT and an FPGA including the LUT cannot be programmed for a plurality of applications in advance, they must be reprogrammed when an application using the LUT is changed.

To avoid reprogramming an LUT in the conventional FPGA, the FPGA must include as many LUTs as applications programmed on the FPGA, and the FPGA must use the LUTs in parallel. In this case, the size of the FPGA depends on the number of applications. When the FPGA must accommodate a large number of applications, the size of the FPGA can be excessive.

SUMMARY

In accordance with the present teachings, an LUT may include a data storage circuit including a plurality of nonvolatile memory elements respectively corresponding to a plurality of applications, the data storage circuit being configured to select one of the plurality of nonvolatile memory elements according to an application selection signal; an amplification circuit configured to amplify a signal output from the selected nonvolatile memory element according to an enable signal output from a decoder; and a write control circuit configured to program the selected nonvolatile memory element with information corresponding to a data signal according to a write signal.

In accordance with the present teachings, an FPGA may comprise a LUT, wherein the LUT includes a plurality of nonvolatile memory elements respectively corresponding to a plurality of applications, the LUT being configured to select one of the plurality of memory elements according to an application selection signal; to output an output signal corresponding to information stored in the selected nonvolatile memory element according to an enable signal output from a decoder; and to program, according to a write signal, the selected nonvolatile memory element with information corresponding to a data signal.

In accordance with the present teachings, a method for designing an FPGA may include determining blocks required for each of a plurality of applications; determining a size of the FPGA accommodating the determined blocks for each of the plurality of applications; and laying out the determined blocks for each of the plurality of applications in a block array of the FPGA.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

FIG. 5 shows a flow chart illustrating a method for determining a size of an FPGA according to an embodiment of the present disclosure.

FIG. 6 shows a flow chart illustrating a method for laying out blocks according to an embodiment of the present disclosure.

FIGS. 7A to 7C illustrate a method for laying out blocks according to an embodiment of the present disclosure.

DETAILED DESCRIPTION

The following detailed description references the accompanying figures in describing exemplary embodiments consistent with this disclosure. The exemplary embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 1:
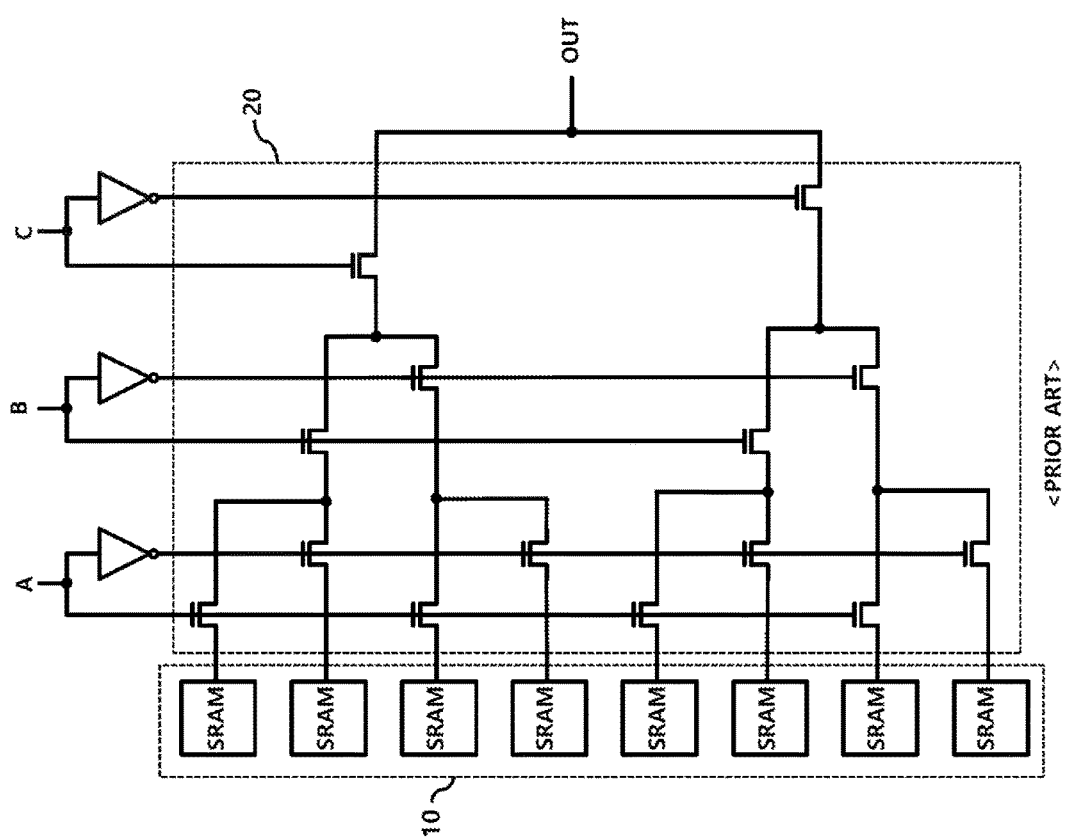
FIG. 1 shows a conventional LUT.
Figure 2:
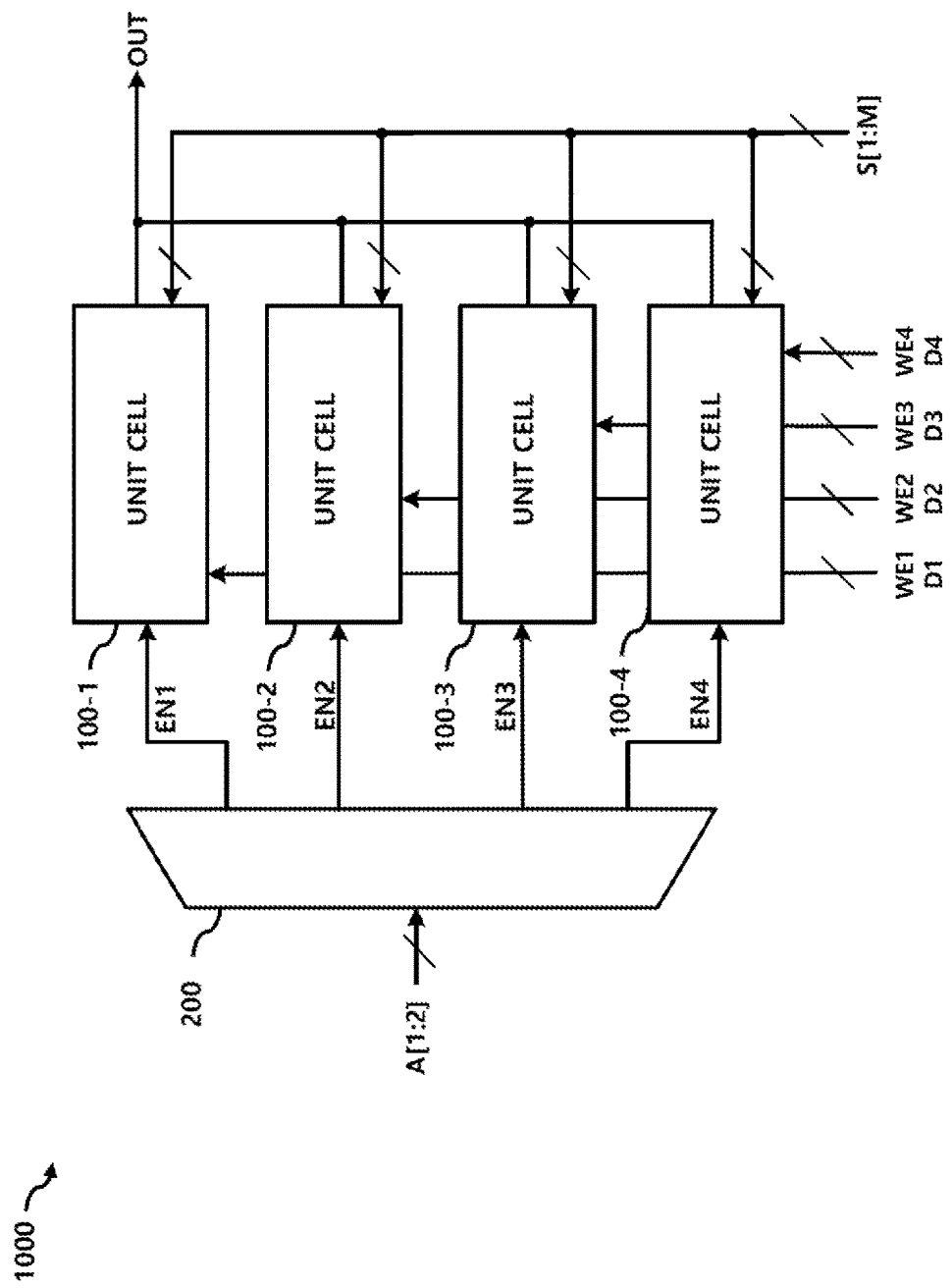
FIG. 2 shows an LUT according to an embodiment of the present disclosure.

FIG. 2 shows an LUT 1000 according to an embodiment of the present disclosure.

The LUT 1000 includes a plurality of unit cells 100-1 to 100-4 and a decoder 200.

The decoder 200 outputs a plurality of enable signals EN1 to EN4 according to a decoding signal A[1:2].

One of the plurality of enable signals EN1 to EN4 is activated and the others are deactivated at the same time. The plurality of unit cells 100-1 to 100-4 have substantially the same structure. A unit cell receiving an activated one of the enable signals EN1 to EN4 provides an output signal OUT.

Each of the plurality of unit cells 100-1 to 100-4 programs a nonvolatile memory element corresponding to an application selection signal S[1:M] in accordance with a corresponding one of data signals D1 to D4 when a corresponding one of write signals WE1 to WE4 is activated, M corresponding to the number of applications. For example, the unit cell 100-1 programs a nonvolatile memory element corresponding to the application selection signal S[1:M] in accordance with the data signal D1 when the write signal WE1 is activated.

Figure 3:
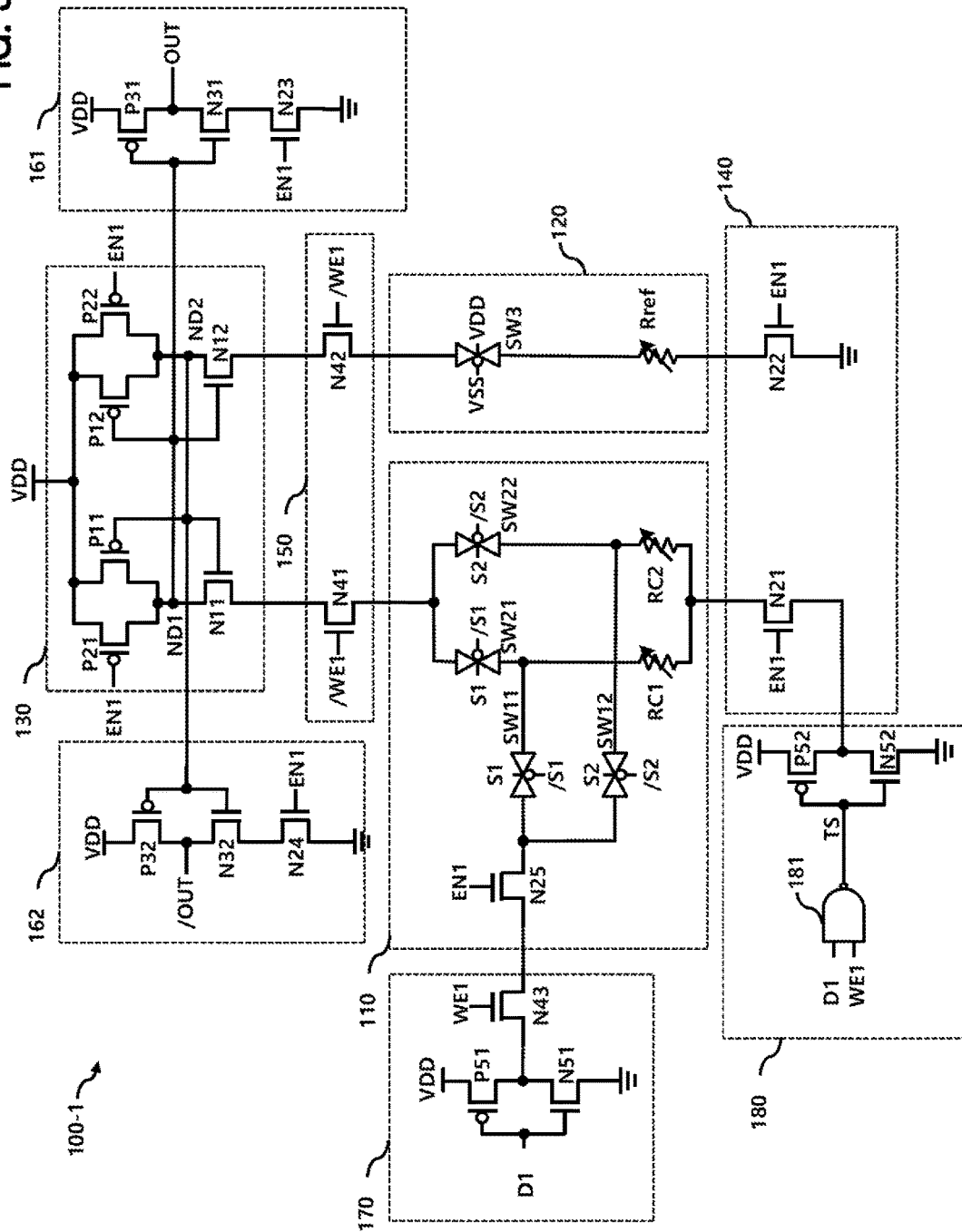
FIG. 3 shows a circuit diagram illustrating a unit cell according to an embodiment of the present disclosure.

FIG. 3 shows a circuit diagram illustrating a unit cell 100-1 according to an embodiment of the present disclosure.

The unit cell 100-1 includes a data storage circuit 110, a reference data storage circuit 120, an amplification circuit 130, a ground circuit 140, a blocking circuit 150, a first data output circuit 161, and a second data output circuit 162.

The unit cell 100-1 further includes a first write control circuit 170 and a second write control circuit 180.

The data storage circuit 110 includes a plurality of nonvolatile memory elements RC1 and RC2, first selection switches SW11 and SW12, and second selection switches SW21 and SW22.

The number of nonvolatile memory elements in a data storage circuit corresponds to the number of applications supported by an LUT including the data storage circuit and the nonvolatile memory elements.

The nonvolatile memory elements RC1 and RC2 are arranged in parallel between two NMOS transistors N41 and N21 that are included in the blocking circuit 150 and the ground circuit 140, respectively.

In this embodiment, each of the nonvolatile memory elements RC1 and RC2 includes a magnetic element, such as a magnetic tunnel junction (MTJ), as an element capable of adjusting a resistance value by adjusting a direction of a current.

Although only two devices, e.g., the nonvolatile memory elements RC1 and RC2, corresponding to two applications are shown in FIG. 3, when the number of applications increases, a corresponding number of devices can be further included in the data storage circuit 110.

The first selection switches SW11 and SW12 couple the corresponding nonvolatile memory elements RC1 and RC2 to an NMOS transistor N25 in response to an application selection signal S[1:2], e.g., a first application selection signal S1 and a second application selection signal S2, respectively.

The NMOS transistor N25 connects the first write control circuit 170 and the first selection switches SW11 and SW12 when an enable signal EN1 is activated.

The second selection switches SW21 and SW22 couple the corresponding nonvolatile memory elements RC1 and RC2 to the NMOS transistor N41 in response to the application selection signal S[1:2], e.g., the first application selection signal S1 and the second application selection signal S2, respectively.

The reference data storage circuit 120 includes a reference nonvolatile memory element Rref and a third selection switch SW3 that are serially connected to each other.

The third selection switch SW3 is included to provide a similar load to the second selection switches SW21 and SW22, and is always turned on to connect the reference nonvolatile memory element Rref to an NMOS transistor N42 included in the blocking circuit 150.

The blocking circuit 150 includes the NMOS transistors N41 and N42, which disconnect the amplification circuit 130 from the data storage circuit 110 and the reference data storage circuit 120 when a write signal WE1 is activated. The blocking circuit 150 connects the amplification circuit 130 to the data storage circuit 110 and the reference data storage circuit 120 when the write signal WE1 is deactivated.

The amplification circuit 130 is connected between a power supply VDD and the blocking circuit 150.

The amplification circuit 130 has a latch structure connected between a first node ND1 and a second node ND2.

The latch structure includes a first inverter including a PMOS transistor P11 and an NMOS transistor N11, and a second inverter including a PMOS transistor P12 and an NMOS transistor N12.

An output terminal of the first inverter is connected to the first node ND1 and an input terminal of the first inverter is connected to the second node ND2. An input terminal of the second inverter is connected to the first node ND1 and an output terminal of the second inverter is connected to the second node ND2.

A PMOS transistor P21 is connected in parallel to the PMOS transistor P11, and a PMOS transistor P22 is connected in parallel to the PMOS transistor P12.

The enable signal EN1 is applied to gates of the PMOS transistors P21 and P22.

When the enable signal EN1 is deactivated, the PMOS transistors P21 and P22 are turned on to precharge the first node ND1 and the second node ND2 with a high voltage level VDD.

In a read operation, when the enable signal EN1 is activated and the write signal WE1 is deactivated, the PMOS transistors P21 and P22 are turned off, and the NMOS transistors N41 and N42 in the blocking circuit 150 are turned on. At this time, the amplification circuit 130 is connected to the data storage circuit 110 and the reference data storage circuit 120, amplifies a signal difference caused by a difference between a resistance value of the data storage circuit 110 and a resistance value of the reference data storage circuit 120, and outputs differential data at the first node ND1 and the second node ND2.

At this time, when the differential data at the first node ND1 and the second node ND2 are sufficiently amplified, one of the PMOS transistor P11 and the NMOS transistor N11 is turned off; the other one of the PMOS transistor P11 and the NMOS transistor N11 is turned on; one of the PMOS transistor P12 and the NMOS transistor N12 is turned on; and the other one of the PMOS transistor P12 and the NMOS transistor N12 is turned off.

As a result, a static current passing through the blocking circuit 150 is cut off, and the power consumption in the unit cell 100-1 is reduced during the read operation.

The first data output circuit 161 inverts a signal at the first node ND1 when the enable signal EN1 is activated, and outputs an output signal OUT.

The first data output circuit 161 includes an inverter including a PMOS transistor P31 and an NMOS transistor N31. The first data output circuit 161 further includes an NMOS transistor N23, which is serially connected to the NMOS transistor N31 and has a gate receiving the enable signal EN1.

The second data output circuit 162 inverts a signal at the second node ND2 when the enable signal EN1 is activated, and outputs an inverted output signal/OUT.

The second data output circuit 162 includes an inverter including a PMOS transistor P32 and an NMOS transistor N32. The second data output circuit 162 further includes an NMOS transistor N24, which is serially connected to the NMOS transistor N32 and has a gate receiving the enable signal EN1.

The ground circuit 140 includes NMOS transistors N21 and N22.

The NMOS transistor N22 connects the reference data storage circuit 120 to the ground VSS when the enable signal EN1 is activated.

The NMOS transistor N21 connects the data storage circuit 110 to the second write control circuit 180 when the enable signal EN1 is activated.

When the write signal WE1 is deactivated, the second write control circuit 180 connects the NMOS transistor N21 to the ground VSS.

Accordingly, when the enable signal EN1 is activated and the write signal WE1 is deactivated in the read operation, the data storage circuit 110 is connected to the ground VSS.

The first write control circuit 170 and the second write control circuit 180 provide a write current to a nonvolatile memory element included in the data storage circuit 110 when the enable signal EN1 and the write signal WE1 are activated in a write operation.

At this time, a direction of the write current is determined according to a data signal D1.

For example, when the data signal D1 is at the high voltage level VDD, the first write control unit 170 outputs a signal corresponding to a low voltage level VSS, and the second write control circuit 180 outputs a signal corresponding to the high voltage level VDD.

Thus, when the data signal D1 is at the high voltage level VDD, a current flowing from the NMOS transistor N21 to the NMOS transistor N25 is provided to a nonvolatile memory element in the data storage circuit 110.

On the same principle, when the data signal D1 is at the low voltage level VSS, a current flowing from the NMOS transistor N25 to the NMOS transistor N21 is provided to a nonvolatile memory element in the data storage circuit 110.

The first write control circuit 170 includes an inverter including a PMOS transistor P51 and an NMOS transistor N51 which receive the data signal D1. The first write control circuit 170 further includes an NMOS transistor N43 having a gate, which receives the write signal WE1. The NMOS transistor N43 selectively provides an output of the inverter to the NMOS transistor N25 in the data storage circuit 110.

The second write control circuit 180 includes a NAND gate 181, which performs a NAND operation on the data signal D1 and the write signal WE1, and an inverter, which inverts an output TS of the NAND gate 181. The inverter in the second write control circuit 180 includes a PMOS transistor P52 and an NMOS transistor N52. An output terminal of the inverter is connected to the NMOS transistor N21 in the ground circuit 140.

As described above with reference to FIGS. 2 and 3, an LUT according to the embodiment of the present disclosure includes a plurality of unit cells each of which includes a plurality of nonvolatile memory elements. In a unit cell, a plurality of nonvolatile memory elements are connected in parallel to each other and are selectively connected to an amplification circuit and a first write control circuit in a read operation and a write operation, respectively, according to an application selection signal S including a plurality of application selection signals. A plurality of nonvolatile memory elements included in a unit cell can be programmed in advance.

Therefore, the LUT according to the embodiment of the present disclosure does not need to be reprogrammed every time an application using the LUT is changed, and an FPGA including the LUT can be pre-programmed to selectively execute a plurality of applications.

Hereinafter, a method of designing an FPGA including an LUT according to an embodiment of the present disclosure will be described.

The FPGA designing method according to the present embodiment can prevent a plurality of applications from being intensively mapped to a specific LUT.

For example, as the number of applications using one LUT increases, the numbers of nonvolatile memory elements and switches included in a data storage circuit of a unit cell in the LUT increase, and the number of wirings for providing application selection signals increases.

Accordingly, embodiments of the present disclosure propose an FPGA design method that effectively distributes the number of applications supported by one LUT.

Figure 4:
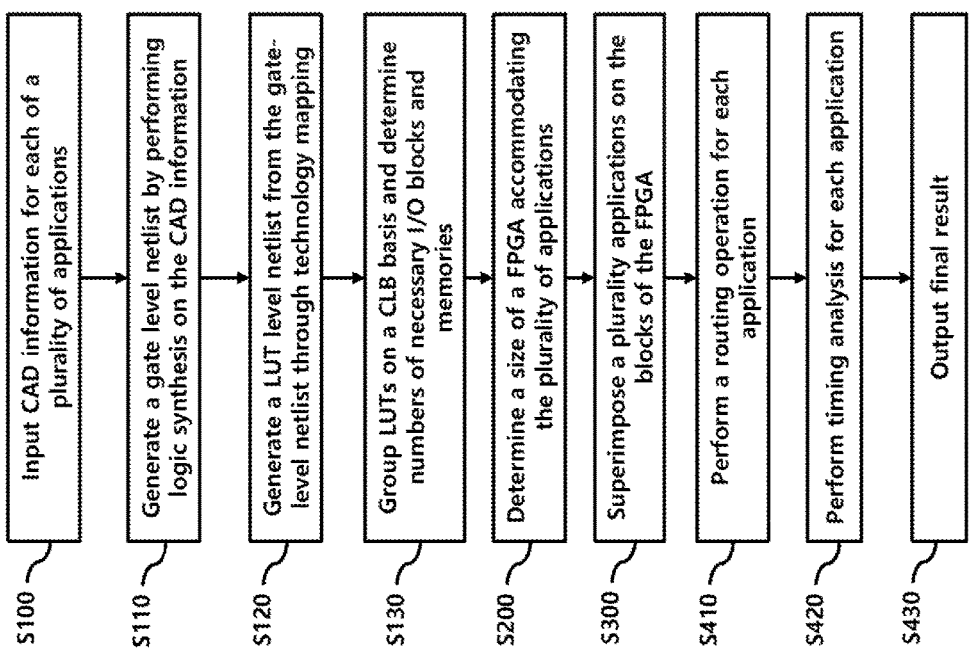
FIG. 4 shows a flow chart illustrating a method for designing an FPGA according to an embodiment of the present disclosure.

FIG. 4 shows a flow chart illustrating a method for designing an FPGA according to an embodiment of the present disclosure.

First, computer-aided design (CAD) information is input for each of a plurality of applications at step S100.

At this time, the CAD information may be information written in a very high speed integrated circuit (VHDIC) hardware description language (VHDL), such as Verilog.

Next, a gate level netlist is generated by performing logic synthesis on the CAD information at step S110.

Next, an LUT level netlist is generated from the gate level net-list through mapping at step S120. This may be referred to as a technology mapping.

Thereafter, LUTs are grouped on a CLB basis, and the numbers of necessary I/O blocks and memories are determined at step S130. The above steps S100 to S130 are performed individually for each application. Therefore, when the step S130 is completed, the same number of results as the number of applications are output.

Then, a size of an FPGA capable of accommodating the plurality of applications is determined at step S200.

FIG. 5 shows a flow chart illustrating a method for determining a size of an FPGA according to an embodiment of the present disclosure. The method shown in FIG. 5 shows details of the step S200 of FIG. 4.

The size of the FPGA can be represented on a block basis. A block may correspond to any of a CLB, a pad block, and a memory block. At this time, a pad block may represent an I/O block.

For example, the size of the FPGA may be represented by the number of CLBs. Therefore, when the size of the FPGA is determined to be 3×3, it means that there are 3 CLBs in each row and 3 CLBs in each column in the FPGA.

To determine the size of the FPGA, the numbers of CLBs, pad blocks, and memory blocks required for each application are sorted in order of magnitudes at step S210.

The maximum number of CLBs, the maximum number of pad blocks, and the maximum number of memory blocks required for the plurality of applications are determined at the step S210.

Then, the size of the FPGA is initialized at step S220.

Next, it is determined whether the initialized size of the FPGA is sufficient to accommodate the maximum number of CLBs at step S230.

If it is determined at the step S230 that the maximum number of CLBs cannot be accommodated by the FPGA having the initialized size, the size of the FPGA is increased by a unit size at step S231, and the step S230 is repeated.

If it is determined at the step S230 that the maximum number of CLBs can be accommodated by the FPGA, then it is determined whether the FPGA can accommodate the maximum number of pad blocks at step S240.

If it is determined at the step S240 that the maximum number of pads cannot be accommodated by the FPGA, the size of the FPGA is increased by a unit size at step S241 and the step S240 is repeated.

If it is determined at the step S240 that the maximum number of pads can be accommodated by the FPGA, then it is determined whether the FPGA can accommodate the maximum number of memory blocks at step S250.

If it is determined at the step S250 that the maximum memory number cannot be accommodated by the FPGA, the process of increasing the size of the FPGA by a unit size at step S251 and the step S250 is repeated.

If it is determined at the step S250 that the maximum number of memories can be accommodated by the FPGA, the size of the FPGA is determined at step S260.

Returning to FIG. 4, when the size of the FPGA is determined at the step S200, the plurality of applications are superimposed on the blocks of the FPGA at step S300.

Superimposing the plurality of applications means laying out blocks of the FPGA for each of the plurality of applications. In this case, the blocks of the FPGA include CLB blocks, pad blocks, and memory blocks.

FIG. 6 shows a flow chart illustrating a method for laying out blocks of an FPGA according to an embodiment of the present disclosure. The method shown in FIG. 6 shows details of the step S300 of FIG. 4.

A block array is generated according to the determined FPGA size and an index i is initialized to 1 at step S310, where the index i indicates a corresponding application.

Blocks for the i-th application are arbitrarily arranged in the block array at step S320.

At this time, blocks are arranged according to kind such as a CLB, a pad block, and a memory block.

Then, the maximum delay of the arrangement for the i-th application is calculated at step S330, and the total number of previously laid out applications overlapped with the blocks arranged for the i-th application is calculated at step S340. The maximum delay of the arrangement for the i-th application may be referred to as a 'first delay,' and the total number of the previously laid out applications overlapped with the blocks arranged for the i-th application may be referred to as a 'first number.'

FIG. 7 shows a diagram illustrating a method for laying out blocks of an FPGA according to an embodiment of the present disclosure.

Figures 7A, 7B, 7C:
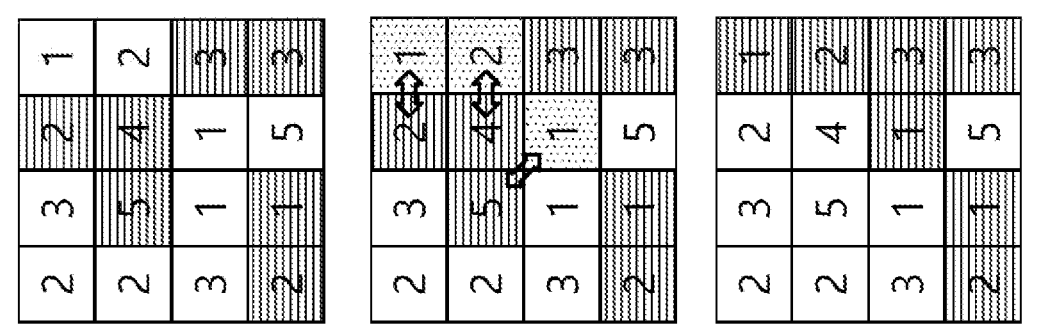

FIG. 7A shows an arrangement of blocks of an FPGA having a size of 4×4.

In this case, the number included in each block represents the number of applications superimposed on each block as a result of laying out blocks for 1st to (i−1)-th applications, where i is a natural number greater than 1.

The blocks with horizontal stripes in FIG. 7A indicate blocks arranged for the i-th application.

In FIG. 7A, the first delay represents the maximum delay of a signal passing through the blocks having the horizontal stripes, and the first number represents a sum of the previously laid out applications superimposed on the blocks having the horizontal stripes, which is 20 (=2+4+5+3+3+2+1).

Returning to FIG. 6, the blocks for the i-th application are rearranged at step S350.

The maximum delay of the blocks rearranged for the i-th application is calculated at step S360, and the total number of previously laid out applications overlapped with the blocks rearranged for the i-th application is calculated at step S370. The maximum delay of the rearranged blocks may be referred to as a 'second delay,' and the total number of the previously laid out applications overlapped with the rearranged blocks may be referred as a 'second number.'

In FIG. 7B, arrows and blocks having dot patterns indicate the rearrangement of the blocks having the horizontal stripes.

In FIG. 7B, the second delay represents the maximum delay of a signal passing through the rearranged blocks after the positions of the blocks are changed, and the second number represents a sum of the previously laid out applications overlapped with the rearranged blocks, which is 13 (=1+2+1+3+3+2+1).

Then, it is determined whether the first delay is smaller than the second delay at step S380.

If the first delay is smaller than the second delay, the rearrangement is invalidated at step S381 and the rearrangement of the blocks is repeated at step S350.

If the first delay is not smaller than the second delay, it is determined whether the first number is greater than or equal to the second number at step S390.

If the first number is smaller than the second number, the rearrangement is invalidated at step S381 and the rearrangement of the blocks is repeated at the step S350.

If the first number is greater than or equal to the second number, the layout of the blocks for the i-th application is completed at step S391.

FIG. 7C shows a state in which the rearrangement of the blocks for the i-th application is completed since the first delay is not smaller than the second delay and the first number is greater than or equal to the second number.

Returning to FIG. 6, it is determined whether the index i is smaller than the number of applications M at step S392.

If the index i is smaller than the number of applications M, the index i is incremented up by 1 and the process proceeds to the step S320 to lay out blocks for the next application.

If the index i is greater than or equal to the number of applications M, layouts for all applications are completed and a result of the layouts is output at step S394.

Depending on embodiments, the order of the steps S380 and S390 of FIG. 6 may be changed and/or the judgment of the step S380 may be omitted.

The flow chart of FIG. 6 shows an embodiment in which the block rearrangement is completed after rearranging the blocks for the i-th application a single time.

In another embodiment, it is possible to consider all possible rearrangements of blocks for the i-th application before completing the layout of the blocks for the i-th application.

The method of calculating a delay amount and the total number of previously laid out applications overlapped with blocks arranged for the i-th application may be variously changed according to embodiments.

Returning to FIG. 4, when the layouts for all applications are completed, a routing operation is performed for each application at step S410.

Switches capable of selecting a route in accordance with the application selection signal S[1:M] can be used when performing the routing operation.

Thereafter, a timing is analyzed for each application at step S420 and a final result is output at step S430.

The timing analysis may include calculating the maximum delay of a signal passing through blocks of the FPGA that are arranged for each application.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A Look Up Table (LUT), comprising:
a data storage circuit including a plurality of nonvolatile memory elements respectively corresponding to a plurality of applications, the data storage circuit being configured to select one of the plurality of nonvolatile memory elements according to an application selection signal;
an amplification circuit configured to amplify a signal output from the selected nonvolatile memory element according to an enable signal output from a decoder;
a write control circuit configured to program the selected nonvolatile memory element with information corresponding to a data signal according to a write signal; and
a reference data storage circuit including a reference nonvolatile memory element,
wherein the amplification circuit is configured to amplify a signal corresponding to a difference between information stored in the selected nonvolatile memory element and information stored in the reference nonvolatile memory element.

2. A Look Up Table (LUT), comprising:
a data storage circuit including a plurality of nonvolatile memory elements respectively corresponding to a plurality of applications, the data storage circuit being configured to select one of the plurality of nonvolatile memory elements according to an application selection signal;
an amplification circuit configured to amplify a signal output from the selected nonvolatile memory element according to an enable signal output from a decoder; and
a write control circuit configured to program the selected nonvolatile memory element with information corresponding to a data signal according to a write signal,
wherein the data storage circuit comprises:
a plurality of first selection switches configured to selectively connect one of the plurality of nonvolatile memory elements with the amplification circuit in response to the application selection signal; and
a plurality of second selection switches configured to selectively connect one of the plurality of nonvolatile memory elements with the write control circuit in response to the application selection signal.

3. The LUT of claim 1, further comprising a data output circuit configured to buffer an output of the amplification circuit.

4. The LUT of claim 1, further comprising a blocking circuit configured to selectively block the amplification circuit from the data storage circuit in response to the write signal.

5. The LUT of claim 1, wherein the write control circuit comprises a first write control circuit and a second write control circuit, the first and second write control circuits being configured to control a direction of a write current flowing through the data storage circuit according to the data signal when the write signal is activated.

6. A Field Programmable Gate Array (FPGA) comprising an LUT, wherein the LUT includes a plurality of nonvolatile memory elements respectively corresponding to a plurality of applications, the LUT being configured to select one of the plurality of memory elements according to an application selection signal; to output an output signal corresponding to information stored in the selected nonvolatile memory element according to an enable signal output from a decoder; and to program, according to a write signal, the selected nonvolatile memory element with information corresponding to a data signal,
wherein the LUT comprises:
a data storage circuit including the plurality of nonvolatile memory elements respectively corresponding to the plurality of applications and configured to select one of the plurality of nonvolatile memory elements according to the application selection signal;
an amplification circuit configured to amplify a signal output from the selected nonvolatile memory element according to the enable signal;
a write control circuit configured to program the selected nonvolatile memory element with the information corresponding to the data signal according to the write signal; and
a reference data storage circuit including a reference nonvolatile memory element,
wherein the amplification circuit is configured to amplify a signal corresponding to a difference between information stored in the selected nonvolatile memory element and information stored in the reference nonvolatile memory element.

7. A Field Programmable Gate Array (FPGA) comprising an LUT, wherein the LUT includes a plurality of nonvolatile memory elements respectively corresponding to a plurality of applications, the LUT being configured to select one of the plurality of memory elements according to an application selection signal; to output an output signal corresponding to information stored in the selected nonvolatile memory element according to an enable signal output from a decoder; and to program, according to a write signal, the selected nonvolatile memory element with information corresponding to a data signal,
wherein the LUT comprises:
a data storage circuit including the plurality of nonvolatile memory elements respectively corresponding to the plurality of applications and configured to select one of the plurality of nonvolatile memory elements according to the application selection signal;
an amplification circuit configured to amplify a signal output from the selected nonvolatile memory element according to the enable signal; and
a write control circuit configured to program the selected nonvolatile memory element with the information corresponding to the data signal according to the write signal,
wherein the data storage circuit comprises:
a plurality of first selection switches configured to selectively connect one of the plurality of nonvolatile memory elements with the amplification circuit in response to the application selection signal; and a plurality of second selection switches configured to selectively connect one of the plurality of non-volatile memory elements with the write control circuit in response to the application selection signal.

8. The FPGA of claim 6, wherein the write control circuit comprises a first write control circuit and a second write control circuit that control a direction of a write current flowing through the data storage circuit according to the data signal when the write signal is activated.

* * * * *